(12) United States Patent
Luo et al.

(10) Patent No.: US 6,791,418 B2
(45) Date of Patent: Sep. 14, 2004

(54) CAPACITOR COUPLED DYNAMIC BIAS BOOSTING CIRCUIT FOR A POWER AMPLIFIER

(75) Inventors: Sifen Luo, Potomac, MD (US); Tirdad Sowlati, Costa Mesa, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 13 days.

(21) Appl. No.: 10/262,765

(22) Filed: Oct. 2, 2002

(65) Prior Publication Data

US 2004/0066234 A1 Apr. 8, 2004

(51) Int. Cl.[7] .............................................. H03G 3/30
(52) U.S. Cl. .................... 330/296; 330/136; 330/285
(58) Field of Search .................... 330/136, 285, 330/296

(56) References Cited

U.S. PATENT DOCUMENTS 5,757,237 A    5/1998  Staudinger et al. ......... 330/296
6,130,579 A   10/2000  Iyer et al. .................... 330/285
6,559,722 B1 * 5/2003  Lopez .......................... 330/296
2002/0113656 A1 8/2002  Iwai ............................ 330/310

FOREIGN PATENT DOCUMENTS

GB    1057097       2/1967
WO    0237670 A1    5/2002

* cited by examiner

Primary Examiner—Steven J. Mottola
(74) Attorney, Agent, or Firm—Aaron Waxler

(57) ABSTRACT

A power amplifier circuit includes an amplifying transistor and a dc bias circuit for biasing the amplifier transistor to obtain a conduction angle of at least about 180°. The dc bias circuit includes a dynamic bias boosting circuit for increasing the dc bias current provided to the amplifying transistor by the dc bias current in direct proportion to an increase in the input signal provided to the power amplifier. An input to the dc bias circuit is coupled to a stage of the power amplifier circuit by a capacitor. The bias boosting circuit permits the power amplifier circuits to operate in Class B or Class AB with improved linearity, improved efficiency and reduced idle current.

7 Claims, 2 Drawing Sheets

US 6,791,418 B2

CAPACITOR COUPLED DYNAMIC BIAS BOOSTING CIRCUIT FOR A POWER AMPLIFIER

BACKGROUND OF THE INVENTION

The invention is in the field of transistor amplifier circuits, and relates more particularly to a power amplifier circuit having a bias boosting circuit for improving amplifier linearity and reducing idle current.

Amplifiers of this general type are frequently used in high-frequency RF amplifiers, as well as in audio amplifiers and other applications. In order to obtain a linear input-output relationship and high operating efficiency, such amplifiers are typically operated with a conduction angle of about 180° (Class B) or slightly greater (Class AB) to avoid crossover distortion.

Typically, amplifiers of this type require a dc bias circuit to establish the quiescent bias current in the amplifier circuit to ensure operation in the Class B or Class AB mode. In the prior art, bias is typically provided by a fixed current source, as shown in U.S. Pat. No. 5,844,443, or else by an external supply, which can be set to a desired constant value to secure the quiescent current necessary to operate in the desired mode, as shown in U.S. Pat. No. 5,548,248.

However, in amplifiers of the type described above the average current drawn from the supply depends upon the input signal level. As the output power increases so does the average current in both the emitter and the base of the power transistor. This increased average current causes an increased voltage drop in the biasing circuitry and in ballast resistors (which are used to avoid hot-spotting and thermal runaway in transistors using an interdigitated design). This in turn reduces the conduction angle (i.e. the number of degrees out of 360° that the amplifier is conducting), and forces the amplifier deep into Class B or even Class C operation, thereby reducing the maximum power output by about 25%. To avoid this power reduction, the amplifier must have a larger quiescent bias. In prior-art circuitry this inevitably leads to a higher power dissipation at low power output levels and therefore an undesirable tradeoff in operating characteristics.

The present inventors have in the past developed various techniques involving improved bias circuits and bias boosting techniques, but these either do not have a signal input from the amplifier circuit, or else have a dc coupled signal input, which has operational disadvantages and design limitations on both the bias circuit and the stage to which it is coupled.

Accordingly, it would be desirable to have a power amplifier circuit which offers the advantages of optimum maximum output power and reduced power dissipation at low power levels, along with improved amplifier linearity and reduced idle current.

SUMMARY OF THE INVENTION

It is therefore an object of the present invention to provide a power amplifier circuit which provides improved maximum output power and less power dissipation at low power levels, along with improved amplifier linearity and reduced idle current.

In accordance with the invention, these objects are achieved by a new power amplifier circuit for amplifying an input signal and having a conduction angle of at least about 180°, the amplifier circuit including an amplifying transistor and a dc bias circuit for biasing the amplifier transistor to obtain the desired conduction angle. The dc bias circuit includes a dynamic bias boosting circuit for increasing the dc bias current provided to the amplifying transistor by the dc bias circuit in direct proportion to an increase in the input signal provided to the power amplifier, and the input of the dc bias circuit is coupled to a stage of the power amplifier circuit by a capacitor.

In a preferred embodiment of the invention, the amplifier circuit is either a Class B or a Class AB amplifier circuit.

In a further preferred embodiment of the invention, the power amplifier circuit also includes a driver stage having a driver transistor, and the capacitor mentioned above is directly connected to the output terminal of the driver transistor.

A power amplifier circuit in accordance with the present invention offers a significant improvement in that a particularly advantageous combination of features, including increased maximum output power and reduced power dissipation at low power levels can be obtained along with improved amplifier linearity and reduced idle current in a simple, compact and economical configuration.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

In the drawing, like reference numerals are generally used to designate like components.

DESCRIPTION OF THE PREFERRED EMBODIMENTS

Figure 1:
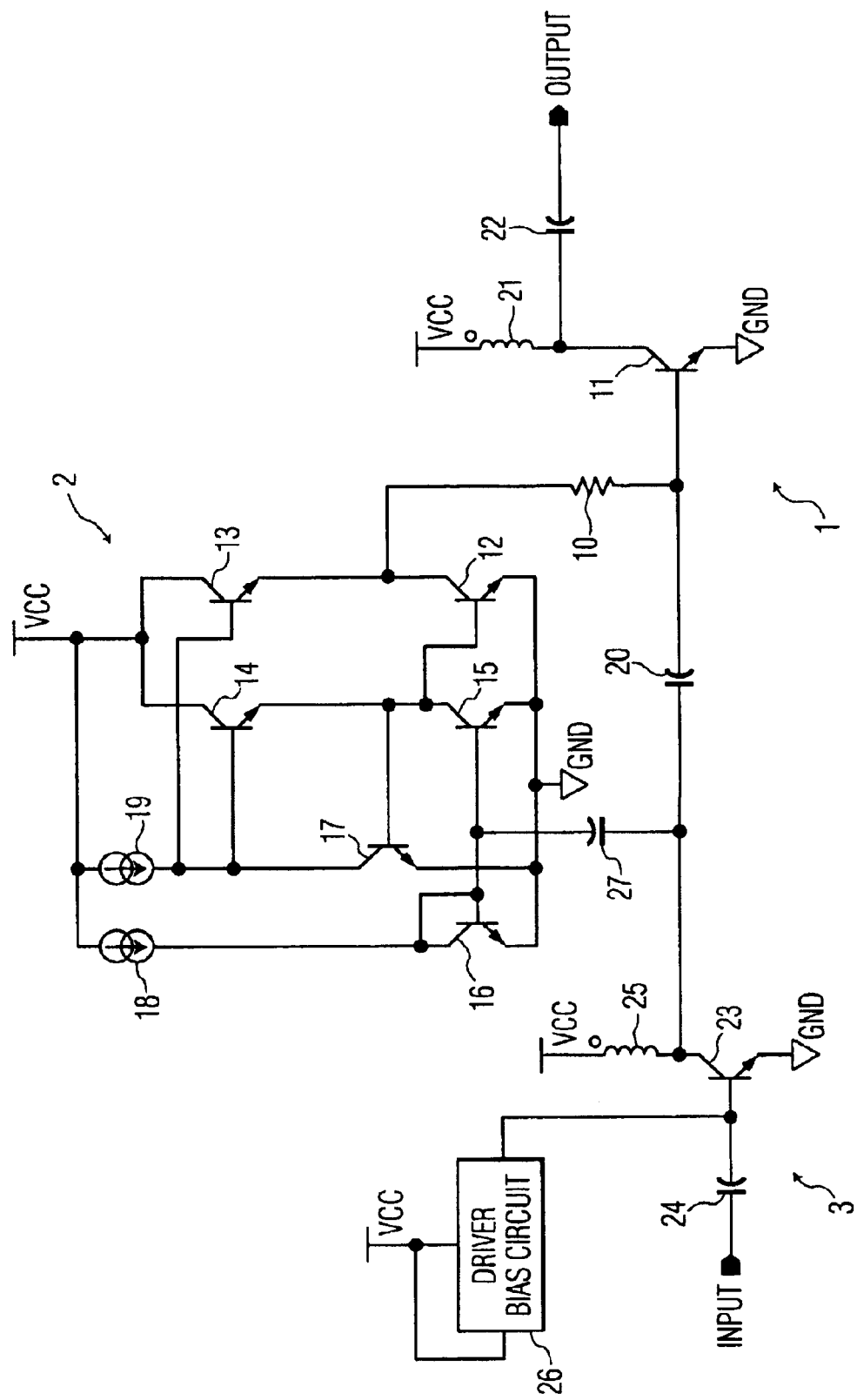
FIG. 1 shows a schematic diagram of a power amplifier circuit in accordance with a first embodiment of the invention.

A simplified schematic diagram of a high-frequency amplifier circuit 1 in accordance with the invention is shown in FIG. 1 of the drawing. The amplifier circuit includes an amplifying transistor 11 and a bias circuit 2 coupled to the base of the amplifying transistor 11 by a resistor 10. The bias circuit 2 includes 6 bipolar transistors (12–17) and two current sources 18 and 19 coupled between Vcc and GND, and is described in further detail below. An input coupling capacitor 20 is provided for coupling an input signal from a driver stage 3 of the amplifier to the base of amplifying transistor 11, with the transistor 11 being connected in a common-emitter configuration and coupled between Vcc and GND by an inductor 21. The Output of the high-frequency amplifier circuit 1 is taken from the collector of transistor 11 through a capacitor 22. The driver stage 3 includes a driver transistor 23 having an Input coupled to its base through a capacitor 24, a Vcc Connection through inductor 25, and an output connected to capacitor 20. The driver transistor 23 is biased by Driver Bias Circuit 26, shown in FIG. 1 in block form.

The amplifying transistor 11 is biased at its base through a connection through resistor 10 to bias circuit 2, which functions as a dynamic bias boosting circuit, and the bias circuit contains two subcircuits such that the quiescent current in the amplifying transistor and the output impedance of the bias stage (the bias impedance of the output stage) can be independently and directly controlled by the two current sources 18 and 19, in a manner to be described in further detail hereinafter.

Each of the bias subcircuits includes a current source and a current mirror. Thus, current source 18 provides a bias current through a current mirror comprising transistors 15 and 16, while current source 19 provides a bias current component through a current mirror comprising transistors 12, 14 and 17.

In operation, the amplifier transistor 11 of the high-frequency amplifier circuit 1 is typically biased for operation in Class AB. However, when the RF input power is very low, it is desirable to operate the amplifying transistor in Class A. Accordingly, it is necessary to control the gain and class of the amplifier, and it is also desirable to independently control the efficiency and linearity of the amplifier.

Independent control of these parameters is obtained by providing two independent current sources in the bias circuit 2, namely current source 18 for controlling the quiescent current of the output stage and thus its class of operation, and current source 19, which controls the output drive current and thus the output impedance of the bias stage (the bias impedance of the output stage). By setting each of these current sources to the desired value, direct and independent control of class of operation and bias impedance can be effectively achieved.

In the circuit shown, the quiescent current in the output stage is proportional to the current provided by current source 18, thus setting the class of operation, while the output impedance of the bias stage is independently controlled by the current source 19. In this manner, the bias circuit permits output-stage gain to be tuned without affecting the bias impedance level.

In overview fashion, and assuming that all transistors in the circuit are identical and perfectly matched, Kirchoff's Law dictates that the sum of the base-emitter voltages of transistors 11 and 13 must be equal to the sum of the base-emitter voltages of transistors 12 and 14. Since the base-emitter voltage of transistor 13 is substantially equal to that of transistor 12, the base-emitter voltage of transistor 11 is therefore substantially equal to that of transistor 14. Since the current from current source 18 flows through transistor 16 it must also flow through transistors 14 and 15, because transistors 15 and 16 form a current mirror. Accordingly, the current in current source 18 dictates the quiescent current in the output transistor 11 and therefore its class of operation and gain.

Again assuming that all transistors are identical and perfectly matched, it can similarly be seen that the current in current source 19 will control the output impedance of the bias circuit. Since transistors 12, 14 and 17 form a current mirror, the current from current source 19 flowing in transistor 17 must also flow in transistor 12 and hence transistor 13. Transistors 12, 13, 14 and 17 form a low impedance path, and the output impedance of the bias circuit is substantially determined by transistors 12 and 17, as dictated by the current provided by current source 19.

By properly scaling the emitter ratios between transistor pairs, a technique well known to those skilled in this art, the quiescent current in transistor 11 can be made directly proportional to the value of the current in current source 18, with the output impedance of the bias circuit being independently controlled by the current in current source 19. Thus, the quiescent current in the amplifying transistor 11 can be controlled, while the bias impedance level may be independently set for increased efficiency and linearity.

Figure 2:
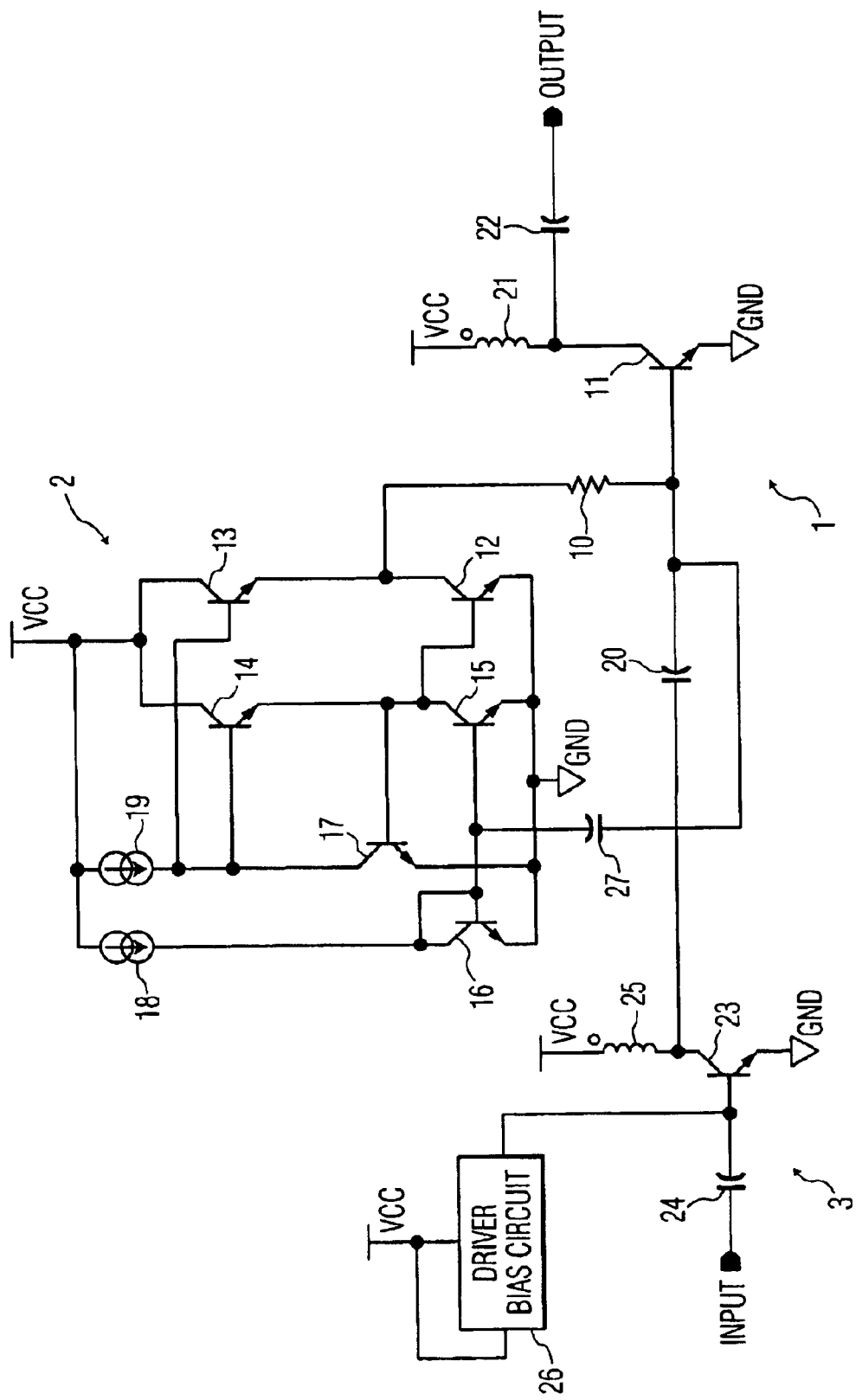
FIG. 2 shows a schematic diagram of a power amplifier circuit in accordance with a second embodiment of the invention.

In accordance with the invention, dynamic bias boosting is achieved by providing a coupling capacitor 27 between the dc bias circuit 2 and a stage of the power amplifier circuit 1. In FIG. 1, capacitor 27 is connected from the collector of transistor 23 in driver stage 3 to the common base connection of transistors 15 and 16 in the bias circuit 2. In an alternative embodiment, the capacitor 27 has one side connected to the base of amplifying transistor 11 rather than to the collector of transistor 23, as shown in FIG. 2. However, the function of capacitor 27, as will be described in further detail below, remains the same, and since FIG. 2 is otherwise the same as FIG. 1, as described above, FIG. 2 will not be described in further detail here.

The purpose of capacitor 27 is to sense an RF signal from a point in the amplifier circuit (either the collector of transistor 23 or the base of transistor 11) and couple this RF signal to the current mirror comprising transistors 15 and 16 in the bias circuit 2, which is typically biased in class AB. The biasing circuitry controls the current flow in the amplifying transistor 11, and as the average current in the mirroring transistors increases, the average current in the amplifying transistor 11 also increases above and beyond that due to the RF signal input to the circuit. Dynamic bias boosting is thus provided, since the average current in the amplifying transistor 11 increases not only due to the RF signal input, but also due to additional current provided by the bias circuit 2 due to its AC coupling to the amplifier circuit through coupling capacitor 27.

In this manner bias boosting is provided which is proportional to the RF input signal independent of the mode in which the amplifying transistor is operated. An advantage of this bias scheme is that it permits the RF amplifier to be biased with a lower quiescent current without pushing it into saturation at higher output power levels. Another advantage of this configuration is that it can be implemented using only npn transistors, and therefore can be used in technologies where pnp transistors are unavailable or difficult to fabricate. It should also be understood that, although the figures show the use of bipolar transistors, the invention is not limited to bipolar transistors, but may also be used in circuits employing FET transistors or a mix of bipolar and FET transistors.

As can be seen from FIGS. 1 and 2, the connection of coupling capacitor 27 to the amplifier circuit may be made at various points along the main signal path of the amplifier. Furthermore, the value of capacitor 27 should be such that the loading effect of this capacitor on the RF amplifier is small, so that the small-signal performance of the amplifier will not be degraded by this capacitor.

In operation, coupling capacitor 27 senses a change in RF input signal, and couples this change to transistor 15. This causes the average current in transistor 15 to increase (transistor 15 may typically be biased in class AB) and this in turn increases the average current in transistor 14. Since transistor 14 controls the quiescent current in transistor 11, with an increase in RF input signal the current in transistor 11 will increase due to an input from the bias circuit 2 coupled to resistor 10, as well as due to the increase in RF signal, thus achieving a dynamic bias boosting condition.

In this manner, the present invention provides a power amplifier circuit which has a capacitor coupled dynamic bias boosting circuit which provides improved maximum output power and less power dissipation at low power levels, along with improved amplifier linearity and reduced idle current. Additionally, by avoiding a dc connection from the amplifier circuit to the input of the bias circuit and by using a suitable value of coupling capacitor, loading effects of the bias circuit can be minimized and small-signal performance of the amplifier will be unaffected by the bias circuit.

While the invention has been particularly shown and described with reference to several preferred embodiments thereof, it will be understood by those skilled in the art that various changes in form and detail may be made without departing from the spirit and scope of the invention. Thus, for example, different types of transistors, dc bias circuits, and driver and power output stages may be employed as appropriate, and alterations to the circuit configuration may be made to suit particular design requirements.

What is claimed is:

1. A power amplifier circuit for amplifying an input signal and having a conduction angle of at least about 180°, said power amplifier circuit comprising an amplifying transistor and a dc bias circuit dc coupled to said amplifying transistor for biasing said amplifying transistor to obtain said conduction angle, said dc bias circuit comprising a dynamic bias boosting circuit for increasing a dc bias current provided to said amplifying transistor by said dc bias circuit in direct proportion to an increase in said input signal provided to said power amplifier circuit, wherein the power amplifier circuit includes a capacitor that directly couples an input of said dc bias circuit to a driver transistor, and a resistor that directly couples an output of said dc bias circuit to said amplifying transistor, the bias circuit including a current mirror.

2. A power amplifier circuit as in claim 1, wherein said amplifier circuit is a Class B amplifier circuit.

3. A power amplifier circuit as in claim 1, wherein said amplifier circuit is a Class AB amplifier circuit.

4. A power amplifier circuit as claimed in claim 1, wherein said capacitor is directly connected to an output terminal of said driver transistor.

5. A power amplifier circuit for amplifying an input signal and having a conduction angle of at least about 180°, said power amplifier circuit comprising an amplifying transistor and a dc bias circuit dc coupled to said amplifying transistor for biasing said amplifying transistor to obtain said conduction angle, said dc bias circuit comprising a dynamic bias boosting circuit for increasing a dc bias current provided to said amplifying transistor by said dc bias circuit in direct proportion to an increase in said input signal provided to said power amplifier circuit, wherein the dc bias circuit includes a capacitor that directly couples an input of said dc bias circuit to the amplifying transistor.

6. A power amplifier circuit for amplifying an input signal and having a conduction angle of at least about 180°, said power amplifier circuit comprising an amplifying transistor and a dc bias circuit dc coupled to said amplifying transistor for biasing said amplifying transistor to obtain said conduction angle, said dc bias circuit comprising a dynamic bias boosting circuit for increasing a dc bias current provided to said amplifying transistor by said dc bias circuit in direct proportion to an increase in said input signal provided to said power amplifier circuit, wherein the dc bias circuit includes a first current source for controlling a quiescent current in the amplifying transistor, and a second current source for controlling an output impedance of the dc bias circuit.

7. A power amplifier circuit as claimed in claim 6, wherein the first current source is coupled to a first current mirror, and the second current source is coupled to a second current mirror.

* * * * *